United States Patent
Tay et al.

(10) Patent No.: US 6,856,155 B2
(45) Date of Patent: Feb. 15, 2005

(54) METHODS AND APPARATUS FOR TESTING AND BURN-IN OF SEMICONDUCTOR DEVICES

(75) Inventors: Wuu Yean Tay, Singapore (SG); Yong Kian Tan, Singapore (SG); Yong Poo Chia, Singapore (SG); Siu Waf Low, Singapore (SG); Suan Jeung Boon, Singapore (SG); Soon Huat Goh, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/266,140

(22) Filed: Oct. 7, 2002

(65) Prior Publication Data

US 2004/0032273 A1 Feb. 19, 2004

(30) Foreign Application Priority Data

Aug. 16, 2002 (SG) ..................... 200204962-5

(51) Int. Cl.$^7$ ............................. G01R 31/02
(52) U.S. Cl. ..................... 324/755; 324/765
(58) Field of Search ............... 324/754–758, 324/761–762, 765; 439/66, 482

(56) References Cited

U.S. PATENT DOCUMENTS

| | | | | |
|---|---|---|---|---|
| 4,970,577 A | * | 11/1990 | Ogihara et al. | 257/698 |
| 5,476,818 A | * | 12/1995 | Yanof et al. | 29/832 |
| 5,477,160 A | * | 12/1995 | Love | 324/755 |
| 6,400,169 B1 | * | 6/2002 | Hembree | 324/755 |
| 6,636,057 B1 | * | 10/2003 | Uchikura | 324/754 |

* cited by examiner

Primary Examiner—Minh N. Tang
(74) Attorney, Agent, or Firm—Snell & Wilmer LLP

(57) ABSTRACT

A testing scheme for ball-grid array devices of different sizes where the same ball-grid pattern may be tested using the same set of test adapters. A testing scheme includes providing a plurality of devices having a predetermined pattern of solder balls attached, providing a plurality of adapters secured to a test board, each of the adapters including a plurality of test contacts arranged in a pattern corresponding to the predetermined pattern of solder balls, removably attaching the plurality of devices to a device holding apparatus such that the predetermined pattern of solder balls on the devices corresponds to the predetermined pattern of test contacts on the plurality of adapters, then positioning the device holding apparatus to bring the plurality of solder balls in contact with the plurality of test contacts.

28 Claims, 7 Drawing Sheets

METHODS AND APPARATUS FOR TESTING AND BURN-IN OF SEMICONDUCTOR DEVICES

CROSS-REFERENCE TO RELATED APPLICATIONS

This application claims priority from Singapore Application No. 200204962-5, filed Aug. 16, 2002.

BACKGROUND OF THE INVENTION

1. Technical Field

The present invention relates, generally, to testing and burn-in of semiconductor devices and, more particularly, to an improved test and burn-in fixture for use with bare die and high-density packages such as ball grid arrays.

2. Background Information

Modern semiconductor fabrication techniques have dramatically increased the density and speed of semiconductor devices, leading to a parallel effort in the field of semiconductor packaging, where increased device density gives rise to many challenges related to electrical connectivity, heat-transfer, manufacturability, and the like. One such challenge relates to the burn-in and testing of ball-grid array (BGA) packages, chip-scale packages (CSP), bumped die, and other such devices using an array of solder balls as contacts.

With such devices, edge-of-package to solder ball location is a critical dimension, and is easily influenced by substrate tolerance issues, processing machinery, test machinery, and other factors. The BGA ball pad location tolerance might be approximately +/−25 microns, while the singulation tolerance of the edges of finished devices may vary by +/−50 microns. Any such errors in alignment may result in erroneous rejection due to poor contacts during electrical tests—errors which will only become more significant as ball pitch becomes smaller and effects such as thermal expansion and the like become more and more dominant.

Furthermore, while ball-grid array patterns may be standardized, the dimensions of the packages or die themselves often vary greatly. Referring to FIG. 1, for example, while the two BGA devices 102 and 106 exhibit the same pattern of solder balls 104, their external package or die dimensions are different, and would therefore require different test adapters for burn-in or functional testing. Specifically, the distance x' from corner 116 to ball 114 on device 106 is significantly larger than dimension x from corner 112 to ball 110 on device 102. Similarly, the dimension y' of device 106 is greater than dimension y of device 102. Traditional BGA test systems would rely on registration of the external package of the devices to corners within a rectangular fixture. As a result, any fixture designed for use with device 102 could not be used with device 106.

Similarly, any wafer-level testing would require refixturing of the test board to accommodate different die geometries. As it is desirable to achieve 100% utilization of burn-in boards, current test systems are inadequate in that rejects during wafer-level testing can not easily be removed after each stage.

Methods are therefore needed in order to overcome these and other limitations of the prior art.

BRIEF SUMMARY OF THE INVENTION

The present invention provides systems and methods which overcome the shortcomings of the prior art by providing a testing scheme wherein ball-grid array devices of different sizes but the same ball-grid pattern may be efficiently and cost-effectively tested using the same set of test adapters.

In accordance with one aspect of the present invention, a testing scheme includes the following steps: providing a plurality of devices having a predetermined pattern of terminals (for example, solder balls) attached thereto; providing a plurality of adapters secured to a test board, each of said adapters including a plurality of test contacts arranged in a pattern corresponding to said predetermined pattern of terminals; removeably attaching said plurality of devices to a device holding apparatus such that said predetermined pattern of terminals on said devices corresponds to said predetermined pattern of test contacts on said plurality of adapters; and positioning said device holding apparatus to bring said plurality of terminals in contact with said plurality of test contacts.

BRIEF DESCRIPTION OF THE SEVERAL VIEWS OF THE DRAWINGS

The subject invention will hereinafter be described in conjunction with the appended drawing figures, wherein like numerals denote like elements, and.

DETAILED DESCRIPTION OF EXEMPLARY EMBODIMENTS

Systems and methods in accordance with the present invention provide a testing scheme wherein ball-grid array devices of different sizes but the same ball-grid pattern may be efficiently and cost-effectively tested using the same set of test adapters.

Figure 1:
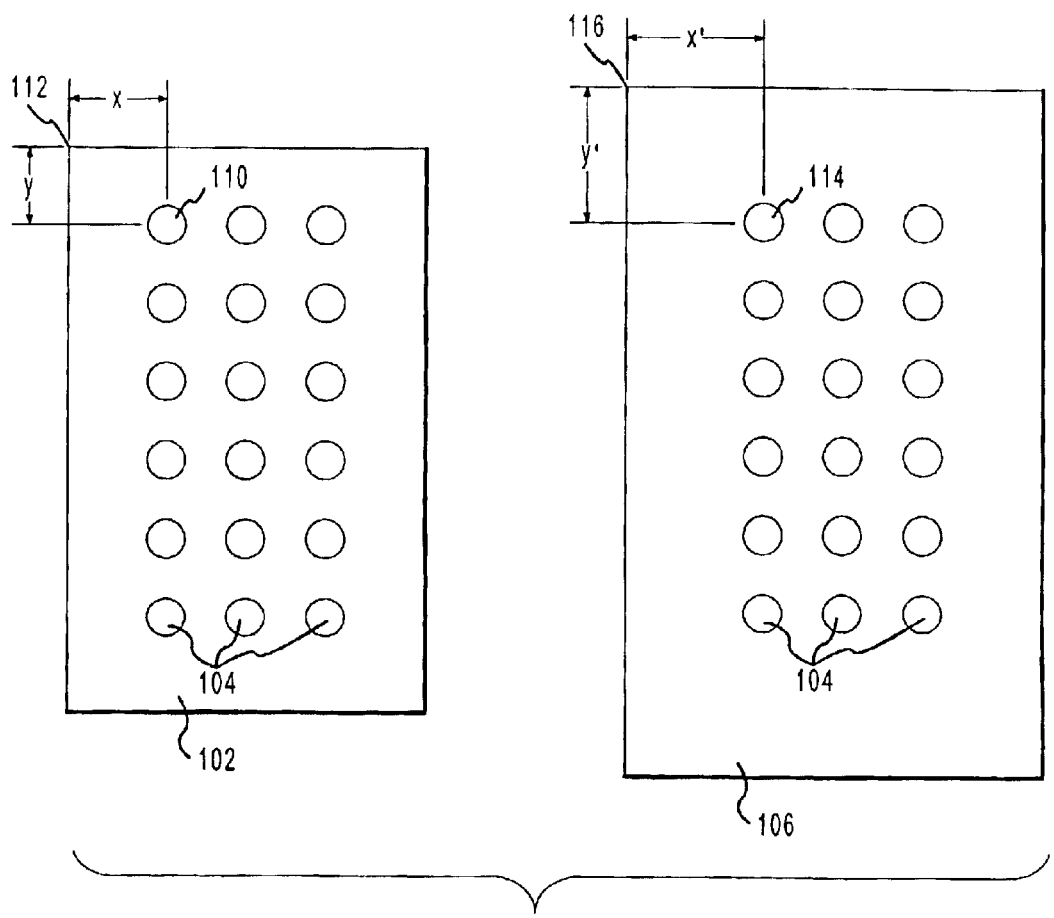
FIG. 1 is a schematic view of typical packages or dice having an array of solder bonds arranged in a grid.
Figure 2:
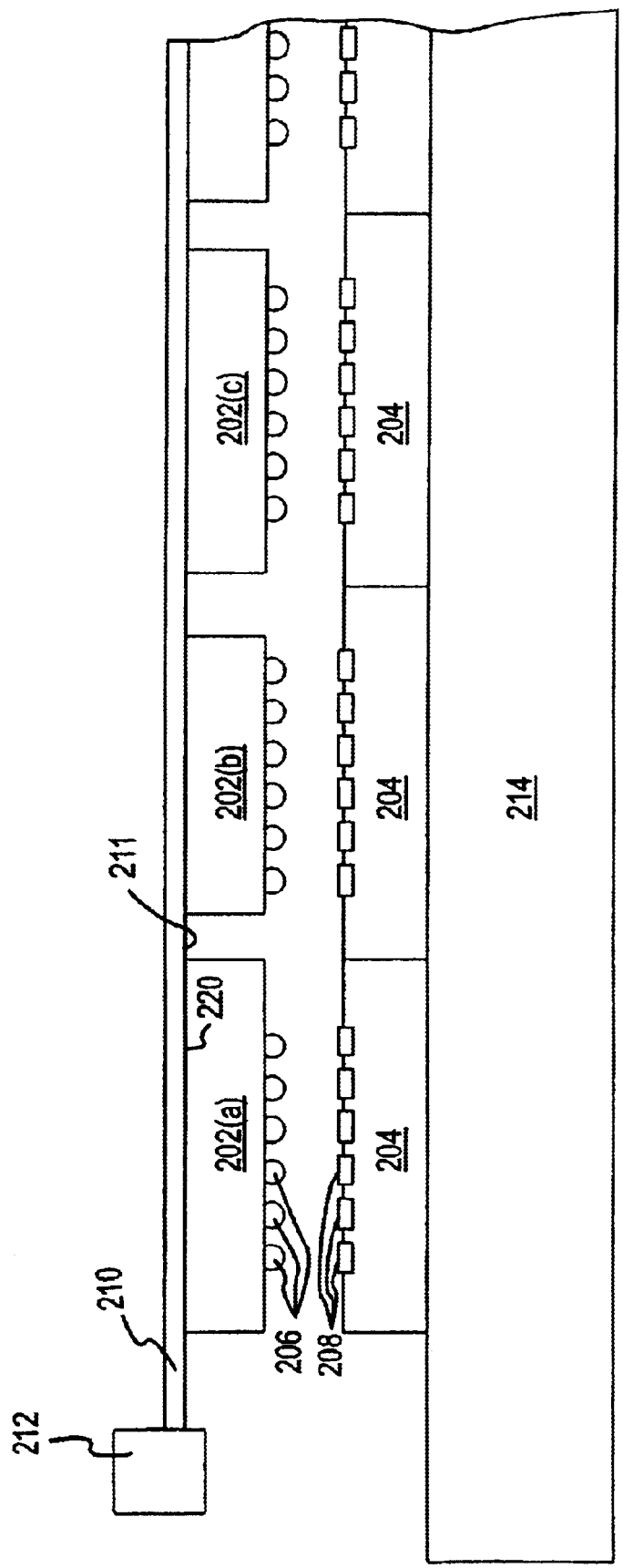
FIG. 2 is schematic cross-sectional view of a testing scheme in accordance with the present invention.

More particularly, referring to FIG. 2, a test apparatus in accordance with one embodiment of the present invention includes a series of adapters 204 connected to a test board 214, wherein each of the adapters 204 includes a number of test contacts 208 which electrically communicate with test board 214. The test contacts 208 are aligned with an array of terminals 206 attached to a corresponding series of devices 202. That is, test contacts 208 are arranged in a grid which matches the terminal pattern (e.g., ball grid pattern) of devices 202. Devices 202 are attached to an adhesive surface 211 of flexible tape 210 which, in the illustrated embodiment, is anchored by a frame or "carrier" 212.

Figure 3:
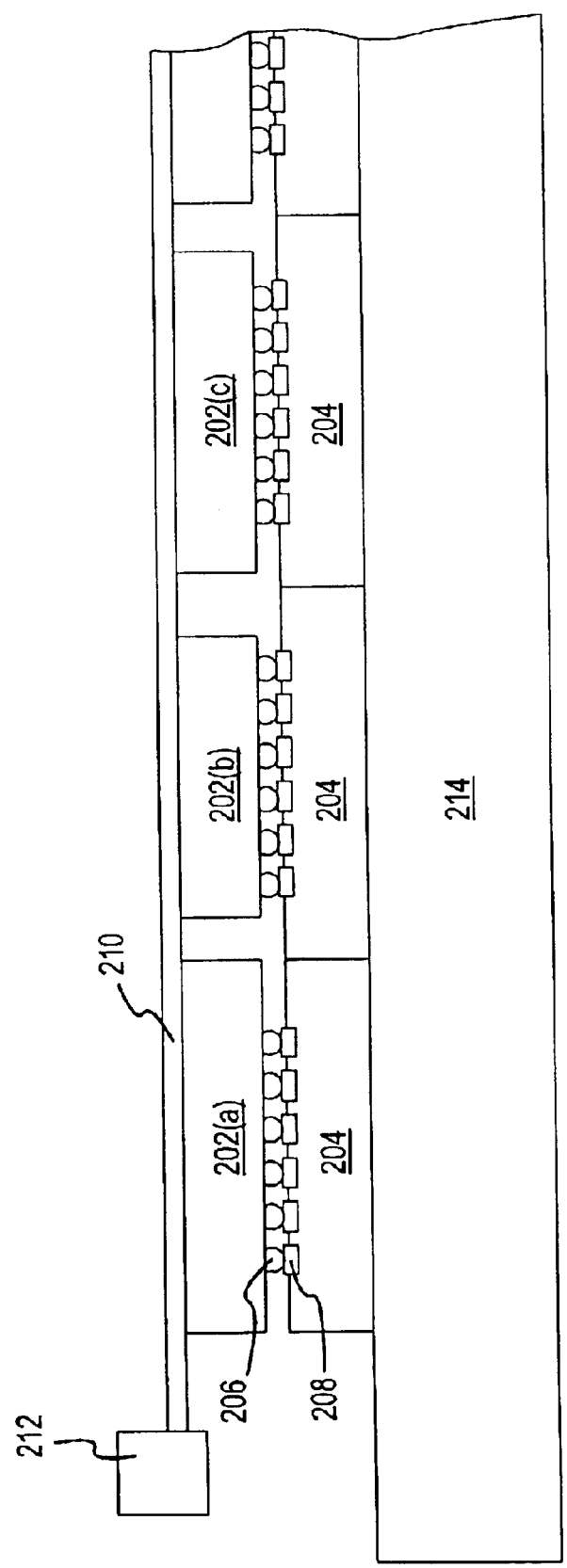
FIG. 3 is a schematic cross-sectional view of the scheme shown in FIG. 2 wherein the ball grid is brought into contact with the test contact array.

As shown in FIG. 3, when carrier 212 and tape 210 are lowered, terminals 206 are brought into contact with corresponding test contacts 208. Because the alignment of terminals 206 with contacts 208 is achieved by proper placement of devices 202 on flexible adhesive tape 210, the dimensions of the device 202 are not critical to achieving good test contact. In the illustration, for example, devices 202(a), 202(b), and 202(c) vary in width, but their respective arrays of terminals 206 properly contact adapters 204.

Figure 4:
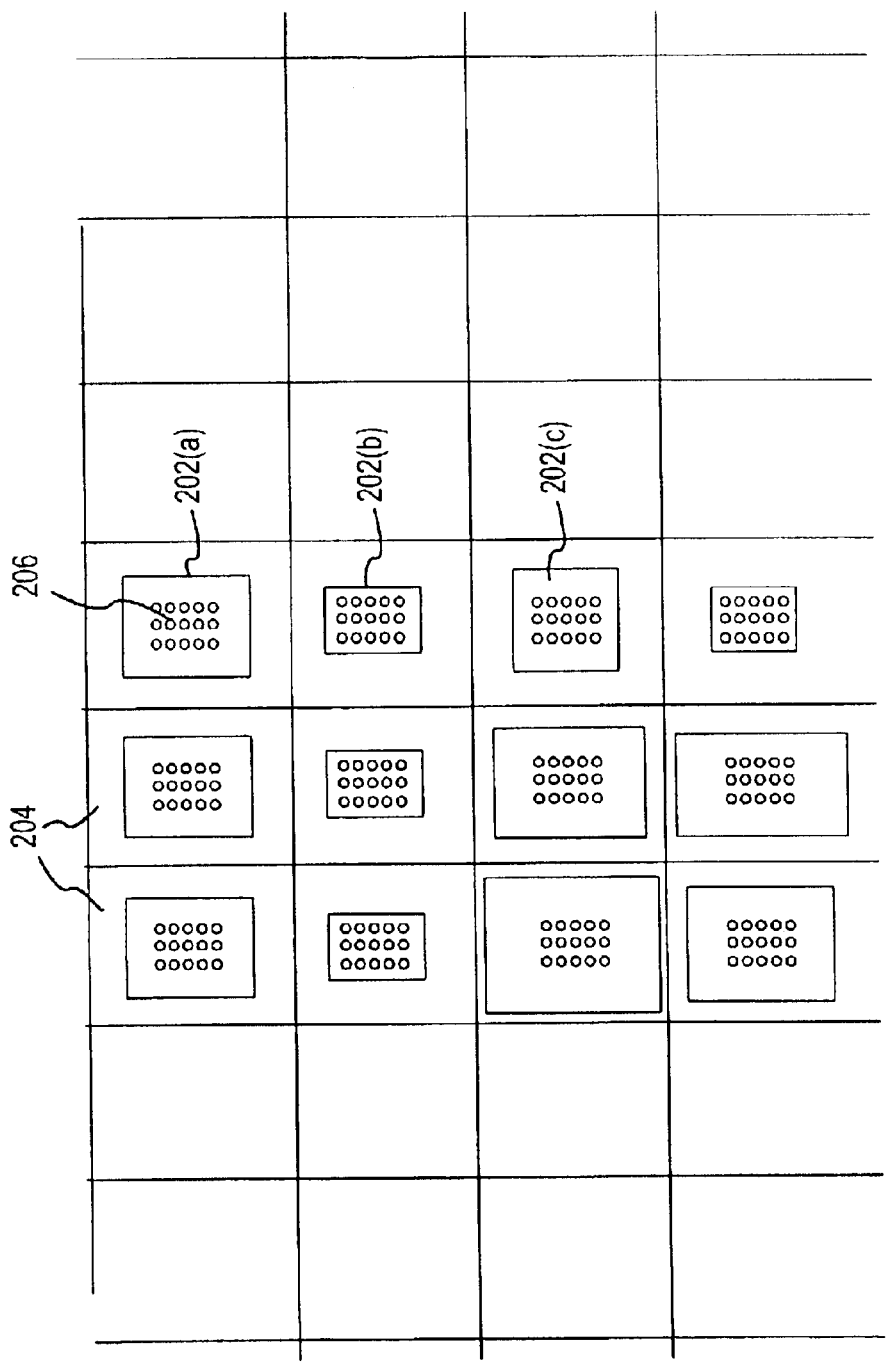
FIG. 4 depicts an array of adapters in accordance with the present invention used to test devices of varying sizes.

This advantage can also be seen in FIG. 4, which shows a top view of a series of adapters 204 configured in a rectilinear pattern. Without loss of generality, the terms "solder balls," "ball grid array," or "balls" are used to describe terminals 206 in the description that follows. Those skilled in the art will recognize that the present invention may be used in connection with any form of terminal, including, for example, various balls, bumps, and the like.

A total of twelve devices 202 with ball grid arrays 206 are shown in FIG. 4. Although the exterior dimensions of devices 202 are different (note, for example, devices 202(a), 202(b), and 202(c)) the ball grid array 206 for each device 202 is similarly situated with respect to adapters 204 (and their corresponding test contacts, not shown). In this illustration, the ball grid array for each device 202 is centered with respect to the rectangular outline of the device. Although this centered array position would typically be the case, the present invention may be used in connection with other configurations, i.e., configuration where the ball grid pattern is not necessarily centered with respect to the package. The pattern itself may be arbitrary, and need not be simply rectangular.

It should be appreciated that the term "device" as used herein is intended to encompass a wide range of package-level, die-level, and wafer-level applications where an array of solder balls or the like are used to provide electrical connectivity to any external boards or components.

In the event device 202 is a semiconductor package, it may comprise, for example, a chip-scale package (CSP) or a ball grid array (BGA) package, including conventional as well as high-lead pitch BGA packages, i.e., plastic ball grid arrays (PBGA), fine-pitch ball grid arrays (FBGA), and thin fine-pitch ball grid arrays (TFBGA).

In the event device 202 corresponds to an individual semiconductor die, either in wafer or sawn form, it may comprise any suitable semiconductor material upon which or within which electronic components may be formed. Suitable materials for devices 202 include, for example, group IV semiconductors (i.e., Si, Ge, and SiGe), group III–V semiconductors (i.e., GaAs, InAs, and AlGaAs), and other less-conventional materials, such as SiC, diamond, and sapphire. Devices 202 may comprise single crystal material, a silicon-on-insulator material (SOI), or one or more polycrystalline or amorphous epitaxial layers formed on a suitable base material. It will be appreciated that devices 202 will also include various electronic components incorporated into the semiconductor material as well as interconnect structures consisting of conductive paths and various dielectrics for isolating these conductive paths. Such electronic components and processing methods are well known and therefore will not be discussed in detail herein.

Solder balls 206 and, consequently, test contacts 208, may be configured in a variety of grid patterns with a wide range of ball-pitch. In one embodiment, the ball grid has a pitch of about 0.5 to 2.0 mm. As is known in the art, solder balls 206 may comprise a variety of materials, e.g., various lead alloys (Sn63Pb37, Sn62Pb36Ag2, Sn10Pb90, etc.), lead-free alloys (Sn95Ag5, Sn65Ag25Sb10, Au80Sn20, Sn95.5Ag4Cu0.5, etc.), and various Cu-core and Ag-core balls.

More background information regarding BGA technology may be found, for example, in John H. Lau, *BALL GRID ARRAY TECHNOLOGY* (1994), and John H. Lau, *FLIP CHIP TECHNOLOGIES* (1995). Additional information regarding basic packaging techniques may be found in a number of standard texts, e.g., Seraphim, Lasky, and Li, *PRINCIPLES OF ELECTRONIC PACKAGING* (1989); John H. Lau, et al., *ELECTRONIC PACKAGING: DESIGN, MATERIALS, PROCESS, AND RELIABILITY* (1998).

In the illustrated embodiment, flexible tape 210 is used to secure devices 202 through the use of an adhesive surface 211 which lightly bonds to surfaces 220 of the devices and which is attached to a carrier 212. Flexible tape 210 may be any suitably material, e.g., any of the various tapes used to secure wafers and die for sawing, testing, and the like. For example, tape 210 may consist of a flexible polyvinylchloride material having an adhesive surface 211 comprising a synthetic acrylic adhesive. Such adhesives can be selected in accordance with whether a low-tack, medium tack, or high-tack adhesive is required.

In one embodiment, carrier 212 comprises a standard inner and outer hoop set, wherein the inner hoop and tape fit concentrically within the outer hoop. The geometry of carrier 212 may be selected in accordance with the size and number of devices being tested. For example, carrier 212 may comprise a conventional circular frame or hoop-set having a diameter of 5"–12". The present invention may be used in conjunction with larger carriers, however.

Figure 5A:
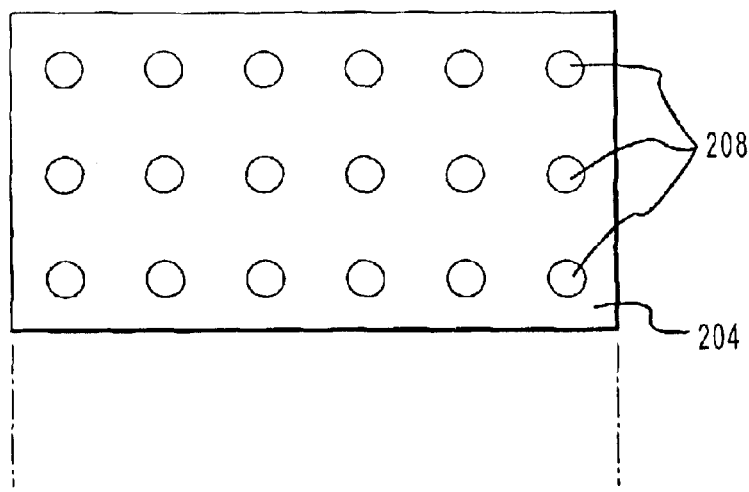
FIGS. 5A and 5B show top and side views of an adapter in accordance with one embodiment of the present invention.
Figure 5B:
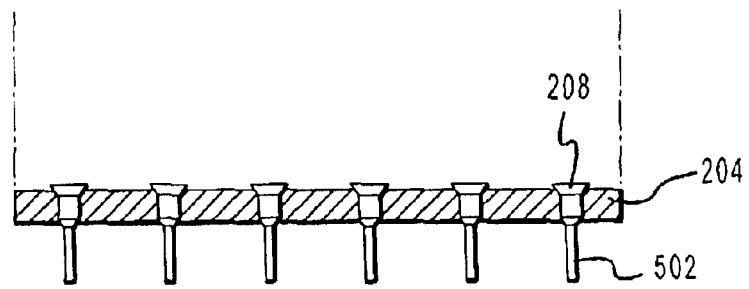

FIGS. 5A and 5B show one embodiment of adapter 204. Specifically, FIG. 5A shows a top view of an adapter 204, and FIG. 5B shows a cross-sectional view. In this embodiment, the array of test contacts 208 are fixed within the body of adapter 204 and each test contact 208 includes a corresponding pin 502 which can be used, for example, to fit into a corresponding socket, either soldered or fixed to the test board or connected to the test board pins' wires in the test board (i.e., test board 214 in FIG. 2). The top surface of contacts 208 may be flat, concave, or any other shape suitable for contacting a solder ball. The diameter of contacts 208 are preferably about the same diameter as the solder balls being contacted, but may be slightly larger or smaller.

Figure 6:
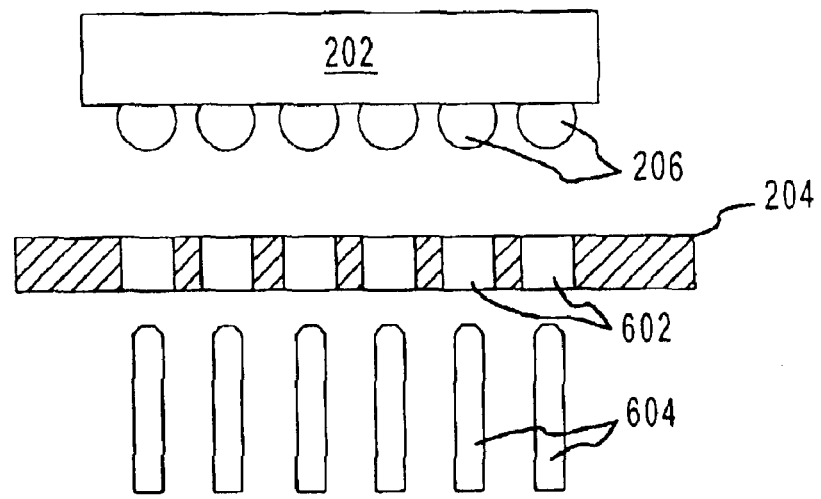
FIGS. 6 and 7 shows a schematic cross-sectional view of an adapter in accordance with another embodiment of the present invention.
Figure 7:
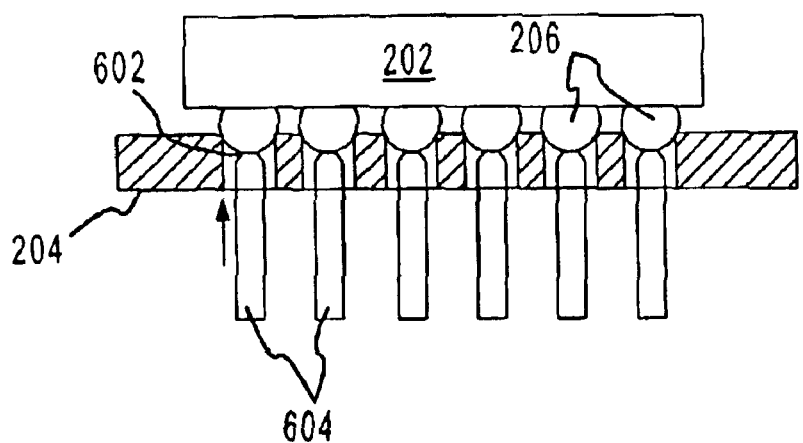

FIGS. 6 and 7 show another embodiment of adapter 204. In this embodiment the adapter 204 includes a number of holes 602 arranged in a pattern corresponding to the ball grid being contacted. A number of probe pins 604 are provided for contacting balls 206 of device 202 through holes 602. Referring to FIG. 7, device 202 is positioned such that balls 206 fit in a self-aligning matter within holes 602. Next, during testing or burn-in, probe pins 604 are moved into contact with solder balls 206. In this embodiment, a flexible tape and adhesive surface may be used as shown in FIG. 2, or, alternatively, a non-adhesive surface may be brought down upon devices 202 to keep them in contact with adapters 204 after the devices 202 have been properly positioned.

The present invention also comprehends a number of additional embodiments for adapter 204 wherein the array of balls 206 are contacted by test contacts 208 of various designs. For example, contacts 208 may be configured as "tweezer" contacts, side contacts, "Y" contacts, spring and pin contacts, metal contacts formed on an elastomer adapter body, conductive epoxy bump contacts, and any other known or future method of contacting solder balls.

Figure 8:
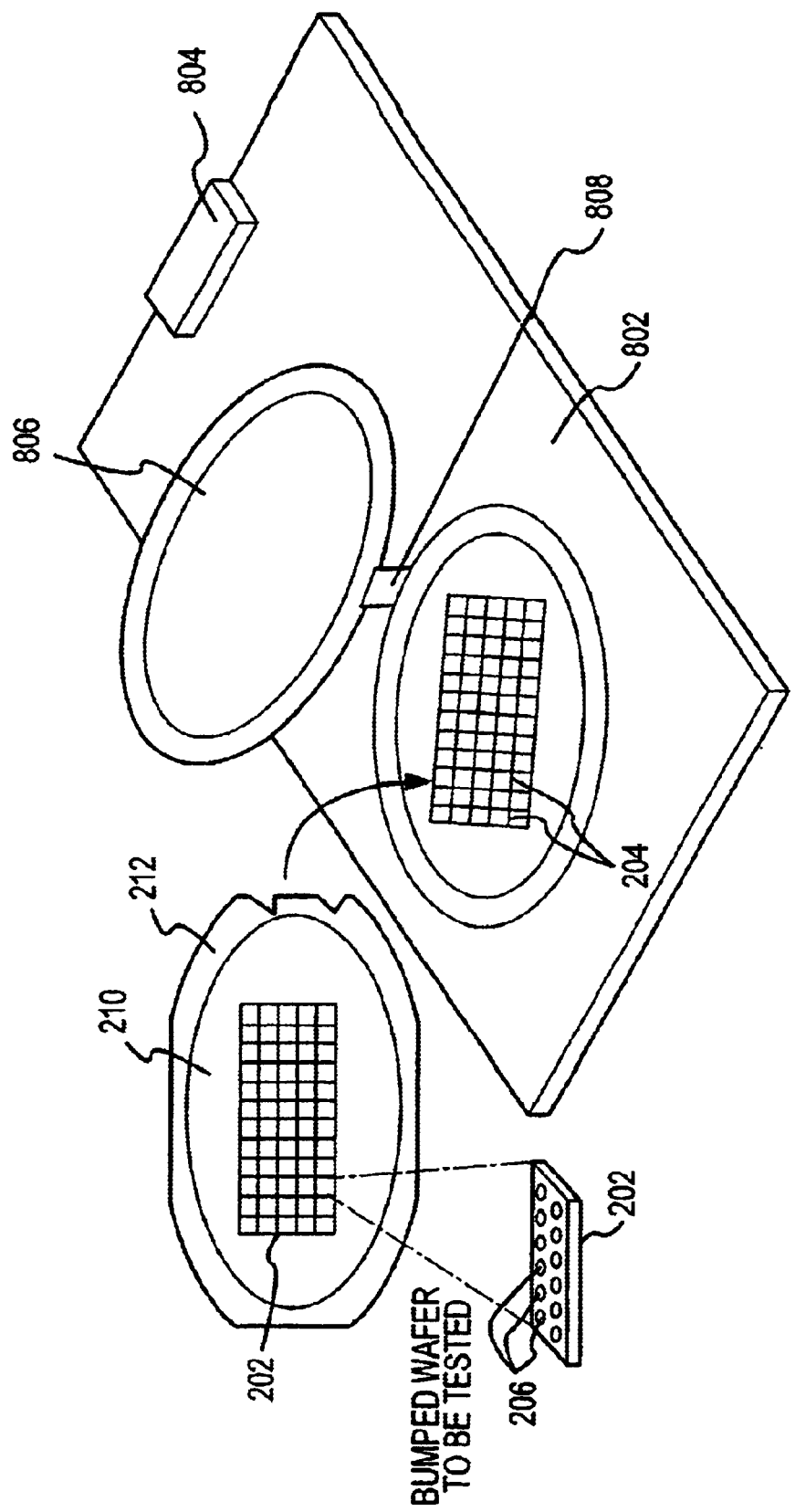
FIG. 8 shows a test assembly in accordance with one embodiment of the present invention.

FIG. 8 shows an example test assembly in accordance with the present invention. Initially, a number of devices 202 are placed on the adhesive surface of tape 210 with solder balls 206 facing outward. These devices may be a subset of dice or package's selected from a previous test step, or may be dice as sawn in wafer form (wafer-level testing). Next, the carrier 212 and tape 210 are placed such that balls 206 on the various devices 202 make contact with respective adapters 204 on test board 802. A clamp subassembly 806 rotateably attached to board 802 via a hinge 808 is closed onto the carrier 212 and suitably held in position. In this embodiment, the flexible tape 210 acts to provide a small amount of pressure to the back of devices 202, ensuring contact with adapters 204. A connector 804 is provided along one edge of test board 802 to allow the board to be plugged into an external test system through a back-plane or other similar socket in the burn-in oven, test chamber, or the like. Electrical wiring and/or metallic traces (not shown) are included on test board 802 to provide electrical connectivity from the various adapters to connector 804.

Although the invention has been described herein in conjunction with the appended drawings, those skilled in the art will appreciate that the scope of the invention is not so limited. Modifications in the selection, design, and arrangement of the various components and steps discussed herein may be made without departing from the scope of the invention as set forth in the appended claims.

What is claimed is:

1. A method for testing semiconductor devices comprising the steps of:
    a) providing a plurality of devices having a predetermined pattern of terminals attached thereto;
    b) providing a plurality of adapters removeably secured to a test board, each of said adapters including a plurality of test contacts arranged in a pattern corresponding to said predetermined pattern of terminals;
    c) removeably attaching said plurality of devices to a device holding apparatus such that said predetermined pattern of terminals on said devices corresponds to said plurality of test contacts on said plurality of adapters;
    d) positioning said device holding apparatus to bring said predetermined pattern plurality of terminals in contact with said plurality of test contacts.

2. The method of claim 1, further including the step of:
    e) subjecting said plurality of devices to electrical testing.

3. The method of claim 1, further including the step of:
    e) subjecting said plurality of devices to burn-in testing.

4. The method of claim 1, wherein said device holding apparatus includes a carrier secured to a flexible tape having an adhesive surface, and wherein said step of removably attaching said plurality of devices to a device holding apparatus includes the step of attaching said plurality of devices to said flexible tape.

5. The method of claim 1, where said step of providing a plurality of devices includes the step of providing a plurality of devices having the same predetermined pattern of terminals but having more than one device size.

6. The method of claim 1, wherein said step of providing a plurality of adapters includes the step of providing a plurality of adapters having a number of pins corresponding to each of said test contacts.

7. The method of claim 1, wherein said step of providing a plurality of adapters includes the step of providing a plurality of adapters having a number of holes configured to accept said predetermined pattern of terminals, and wherein said method further includes the step of bringing a plurality of probes into contact with said terminals through said holes in said adapters.

8. The method of claim 1, wherein said positioning step includes the step of rotating a clamp subassembly secured to said device holding apparatus, said device holding apparatus having a connector provided thereon for connecting to an external test system.

9. The method of claim 1, wherein said step of providing a plurality of devices includes the step of providing a plurality of ball grid array devices having a rectangular array of solder balls attached thereto.

10. The method of claim 9, wherein said test contacts have an area substantially equal to the cross-sectional area of said solder balls.

11. The method of claim 1, wherein said predetermined pattern of terminals is off-center with respect to each of said devices.

12. A test apparatus comprising:
    a plurality of adapters removeably secured to a test board, each of said adapters including a plurality of test contacts arranged in a pattern configured to interface with a plurality of devices having a predetermined pattern of terminals;
    a device holding apparatus to which said plurality of devices are removeably secured such that said predetermined pattern of terminals on said devices corresponds to said plurality of test contacts on said plurality of adapters;
    a positioning subassembly configured to move said device holding apparatus to bring said predetermined pattern of terminals in contact with said plurality of test contacts;
    an external test device electrically coupled to said test board, said external test device configured to subject said plurality of devices to electrical testing.

13. The test apparatus of claim 12, wherein said device holding apparatus includes a carrier secured to a flexible tape having an adhesive surface configured to accept said plurality of devices.

14. The test apparatus of claim 12, wherein said device holding apparatus is configured to receive devices having different dimensions.

15. The test apparatus of claim 12, wherein said adapters include a plurality of pins corresponding to each of said test contacts.

16. The test apparatus of claim 12, wherein said plurality of adapters include a plurality of holes configured to accept said predetermined pattern of terminals, further including a plurality of probes configured to be brought into contact with said terminals through said holes in said adapters.

17. The test apparatus of claim 12, further including a clamp subassembly removably secured to said device holding apparatus, said device holding apparatus having a connector provided thereon for connecting to an external test system.

18. The test apparatus of claim 12, wherein said devices comprise an array of solder bumps configured in a geometric pattern.

19. The test apparatus of claim 12, wherein said predetermined pattern of terminals is off-center with respect to said devices.

20. The test apparatus of claim 12, wherein said test contacts have an area substantially equal to the cross-sectional area of said terminals.

21. A method of testing ball-grid array devices of the type having an array of solder balls attached thereto, said method comprising the steps of:
    providing a plurality of adapters removeably secured to a test board, each of said adapters including a plurality of test contacts arranged in an array corresponding to said array of solder balls, said test contacts electrically coupled to said test board, said test board electrically coupled to an external test system;

removably attaching said plurality of ball-grid array devices to a flexible tape such that said array of solder balls on said devices corresponds to said test contacts on said plurality of adapters, wherein said flexible tape is secured to a carrier;

positioning said carrier and said flexible tape to bring said plurality of solder balls in contact with said plurality of test contacts; and activating said external test system to test said ball grid array devices.

22. The method of claim 21, wherein said positioning step includes the step of rotating a clamp subassembly secured to said carrier, said carrier having a connector provided thereon for connecting to said external test system.

23. A ball-grid array test apparatus for testing ball-grid array devices of the type having a predetermined pattern of solder balls attached thereto, said ball-grid array test apparatus comprising:

a test board having a clamp subassembly and a connector, said connector configured to provide electrical connectivity between said test board and an external test system a regular array of test adapters removeably secured to said test board, each of said adapters including a plurality of test contacts arranged in a pattern corresponding to said predetermined pattern of solder balls, wherein said test contacts are electrically coupled to said test board;

a carrier supporting a flexible tape having an adhesive surface;

a positioning system for attaching said plurality of ball-grid array devices to said adhesive surface such that said predetermined pattern of solder balls on said devices corresponds to said test contacts on said plurality of adapters, wherein said flexible tape is secured to said carrier;

said clamp subassembly configured to position said carrier and said flexible tape to bring said plurality of solder balls in contact with said plurality of test contacts.

24. A test apparatus comprising:

adapting means for providing a test contact pattern, said test contact pattern configured to interface with devices having a predetermined pattern of terminals;

device holding means for removeably securing said devices such that said predetermined pattern of terminals on said devices corresponds to said test contact pattern on said adapting means;

positioning means for moving said device holding means to bring said predetermined pattern of terminals in contact with said test contact pattern;

testing means for subjected said devices to electrical testing, said testing means electrically coupled to said device holding means.

25. A device holder comprising:

a carrier;

a flexible tape secured to said carrier;

said flexible tape having an adhesive surface configured to removeably secure a plurality of devices such that a predetermined pattern of terminals on said devices correspond to a predetermined pattern of test contacts on a test apparatus associated therewith, wherein said predetermined pattern of test contacts is provided on a plurality of adapters secured to said test apparatus, each of said adapters including a plurality of test contacts.

26. The device holder of claim 25, wherein said flexible tape comprises polyvinylchloride.

27. The device holder of claim 25, wherein said adhesive surface comprises a synthetic acrylic adhesive.

28. The device holder of claim 25, wherein said carrier comprises an inner hoop and an outer hoop.

* * * * *